(12) United States Patent
Harding

(10) Patent No.: US 10,693,052 B2
(45) Date of Patent: Jun. 23, 2020

(54) SYSTEM AND METHOD FOR ENERGY HARVESTING IN A DATA CENTER

(71) Applicant: ABB Schweiz AG, Baden (CH)

(72) Inventor: Jeffrey Harding, Holly Springs, NC (US)

(73) Assignee: ABB Schweiz AG, Baden (CH)

( * ) Notice: Subject to any disclaimer, the term of this patent is extended or adjusted under 35 U.S.C. 154(b) by 393 days.

(21) Appl. No.: 14/442,645

(22) PCT Filed: Nov. 25, 2013

(86) PCT No.: PCT/US2013/071603
§ 371 (c)(1),
(2) Date: May 13, 2015

(87) PCT Pub. No.: WO2014/082028
PCT Pub. Date: May 30, 2014

(65) Prior Publication Data
US 2016/0284962 A1    Sep. 29, 2016
US 2018/0013049 A9    Jan. 11, 2018

Related U.S. Application Data

(60) Provisional application No. 61/729,955, filed on Nov. 26, 2012.

(51) Int. Cl.
*H01L 35/30* (2006.01)
*H05K 7/20* (2006.01)
*H01L 35/02* (2006.01)

(52) U.S. Cl.
CPC .............. *H01L 35/30* (2013.01); *H01L 35/02* (2013.01); *H05K 7/20736* (2013.01); *H05K 7/20745* (2013.01)

(58) Field of Classification Search
CPC ........... H05K 7/20745; H05K 7/20736; H05K 7/20709; H05K 7/20727; H01L 35/30; H01L 31/30; H01L 31/32; H01L 31/34
See application file for complete search history.

(56) References Cited

U.S. PATENT DOCUMENTS

| | | | |
|---|---|---|---|
| 7,242,580 B1 | 7/2007 | Tanaka | |
| 9,041,250 B1 * | 5/2015 | Czamara | H02J 3/14 307/64 |
| 2002/0139123 A1 * | 10/2002 | Bell | F02G 1/043 62/3.7 |

(Continued)

OTHER PUBLICATIONS

Sicuranza, "The Case for Thermoelectrics in the Data Center", Applied Methodologies, All Pages. (Year: 2009).*

*Primary Examiner* — Daniel P Malley, Jr.
(74) *Attorney, Agent, or Firm* — Taft Stettinius & Hollister LLP; J. Bruce Schelkopf

(57) ABSTRACT

A system and method for energy harvesting in a data center has one or more collection devices, a thermoelectric device, and a controller for directing the operation of the thermoelectric device and other equipment in the data center. The waste heat generated by the servers in the data center is harnessed and directed into the thermoelectric device where the waste heat is converted to usable electrical energy under the direction of the controller. The recycled electrical energy is then combined with utility-input power and provided to the servers and other equipment in the data center for consumption.

13 Claims, 4 Drawing Sheets

(56) References Cited

U.S. PATENT DOCUMENTS

| | | | |
|---|---|---|---|
| 2008/0209237 A1* | 8/2008 | Kim .................. | G06F 1/263 |
| | | | 713/300 |
| 2010/0043858 A1* | 2/2010 | Matsui ................ | H01L 35/28 |
| | | | 136/205 |
| 2010/0216388 A1* | 8/2010 | Tresh ................ | H05K 7/20745 |
| | | | 454/184 |
| 2012/0152298 A1* | 6/2012 | Casali ................ | H05K 7/20709 |
| | | | 136/212 |
| 2012/0279233 A1 | 11/2012 | Chainer et al. | |
| 2012/0298334 A1* | 11/2012 | Madaffari .......... | H05K 7/20745 |
| | | | 165/104.13 |
| 2012/0306274 A1* | 12/2012 | Shetler, Jr. ............ | H02J 9/062 |
| | | | 307/64 |
| 2013/0300266 A1* | 11/2013 | Ramey ............... | A47B 87/0276 |
| | | | 312/111 |

\* cited by examiner

SYSTEM AND METHOD FOR ENERGY HARVESTING IN A DATA CENTER

FIELD OF INVENTION

The present application is directed to a system and method for energy harvesting in a data center.

BACKGROUND

Modern data centers consume tens of Megawatts of power with little regard for energy efficiency. On average, each server rack in a typical data center consumes electricity on the order of 8 kW. In a data center utilizing higher density server racks, the electricity consumed by data center operations may exceed 30 kW per server rack.

A typical data center operates at around a power usage effectiveness (PUE) of about 2.0 which indicates that the data center's overall power demand is about two times greater than the Information Technology (IT) equipment load. In an average data center, that equates to for each one Watt of power consumed by the IT equipment, an additional one Watt of power is utilized for cooling and delivering power to the IT equipment.

Most of the electrical energy utilized by the data center is consumed by the computing units and temperature control equipment in the data center, and expelled as waste heat. Additional power is used to expel the waste heat from the data center into the surrounding environment.

SUMMARY

An object of the present invention is to provide a system and method for harvesting waste heat generated by data center operations. The energy harvesting system generates from the waste heat, electricity usable by computing devices in the data center. In this way, the energy harvesting system is able to recycle waste heat energy that would otherwise be lost, and use that energy to power information technology equipment in the data center.

The energy harvesting system has one or more collection devices, a thermoelectric device and a controller. The one or more collection devices direct waste heat and room temperature air in the data center into a thermoelectric device. The thermoelectric device receives the waste heat and room temperature air as input, interprets a temperature gradient between the waste heat and room temperature air, and generates from the temperature gradient an electrical potential as an output. The controller directs the conversion of the thermoelectric device-generated electrical potential to usable electricity and combines the usable electricity combinable with utility-input electricity to deliver power to the computing devices in the data center.

A method for generating from waste heat in a data center, electricity usable by computing devices in said data center, comprising:

a. directing waste heat expelled by computing devices in said data center into a thermoelectric device;

b. determining a temperature gradient between said waste heat generated by computing devices in said data center and room temperature air in said data center;

c. converting said temperature gradient into electric potential;

d. converting said electrical potential into electricity usable by computing devices in said data center;

e. combining said usable electricity with utility-input electricity; and f. operating said computing devices using said combination of usable electricity with utility-input electricity.

BRIEF DESCRIPTION OF THE DRAWINGS

In the accompanying drawings, structural embodiments are illustrated that, together with the detailed description provided below, describe exemplary embodiments of a system and method for energy harvesting in a data center. One of ordinary skill in the art will appreciate that a component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

DETAILED DESCRIPTION

Figure 1:
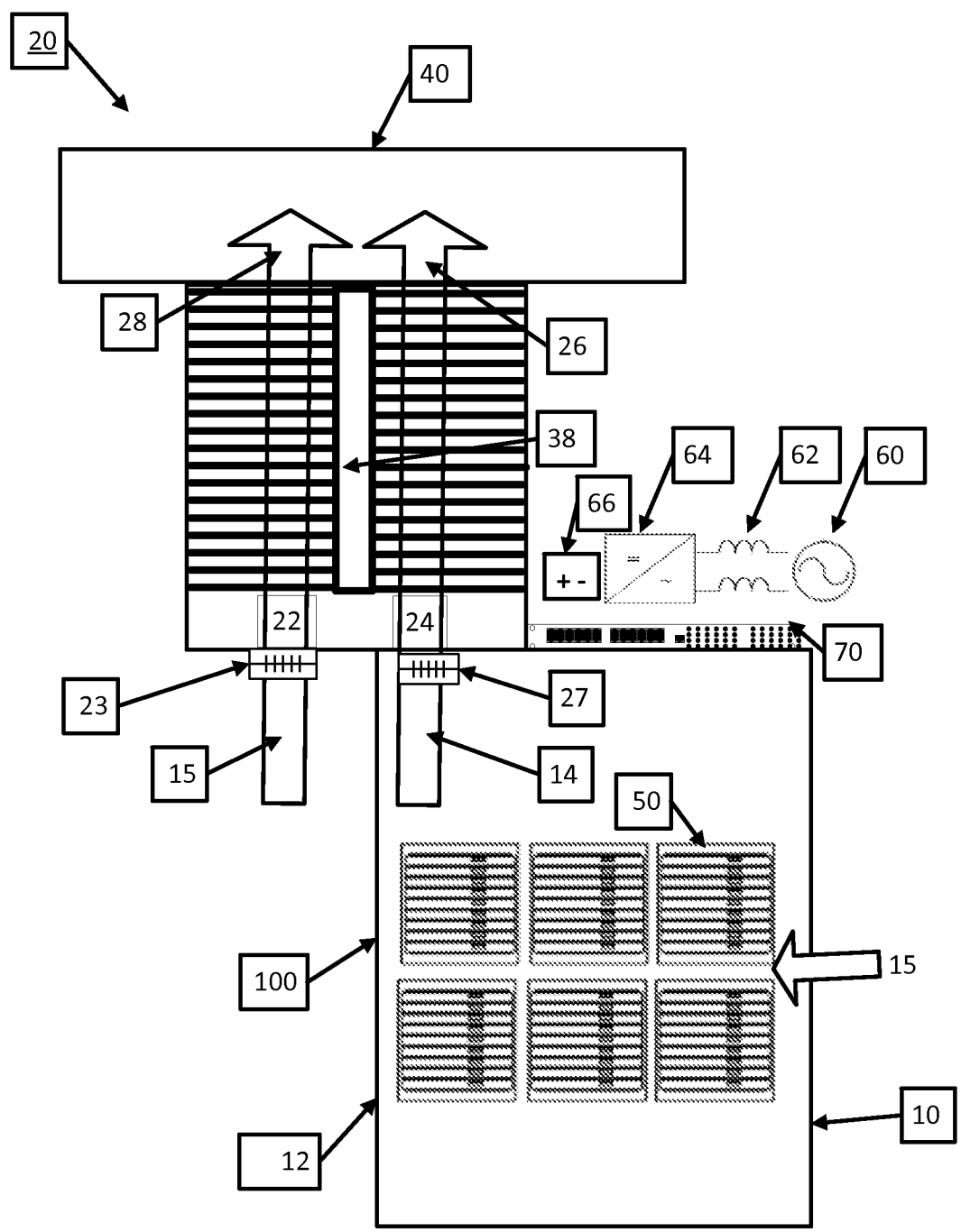
FIG. 1 is a schematic view of a first embodiment of a data center having a an energy harvesting system embodied in accordance with the present invention.

A first embodiment of an energy harvesting system 20 for recovering waste heat in a data center 100 is shown in FIG. 1. The energy harvesting system 20 recovers the waste heat generated by data center 100 operations, transforms the waste heat into usable energy, and provides the usable energy for consumption by the electronic devices and other equipment in the data center 100.

The data center 100 is comprised of racks of servers 50 such as application, network and other types of servers, devices such as power distribution units, batteries, rectifiers, inverters, computer room air handlers (CRAH), computer room air conditioners (CRAC), transformers, generators and other equipment necessary for conducting the operations of a data center.

The data center 100 occupies an enclosed space such as a room in a building, an entire building, a transportable container such as a shipping container for land or water transport, an underground location or any type of enclosure or environment that protects the computing equipment from heat, moisture, and other factors detrimental to the operation of computing equipment. Each server 50 rack is enclosed by a cabinet having a vented front door.

Alternatively, multiple server racks are provided in a room having four walls, and upon the front wall is mounted a door 10 that is vented. The door 10 is formed from fiber-reinforced plastic, metal or another suitable material and may be perforated or otherwise vented for permitting the passage of air between the data center 100 and the surrounding environment or building.

In one embodiment, the data center 100 operates at about a power utilization effectiveness (PUE) of 2.0. PUE represented the total power to the data center 100 divided by the power consumed by the IT equipment. In that same embodiment, for each one-Watt of power used by the data center 100 computing equipment, a second one-Watt of power is used by the facility equipment to cool and otherwise support the computing equipment.

The energy harvesting system 20 is capable to reduce the energy requirements and/or IT equipment load by generating power from the recovered waste heat. The amount of power generated is dependent upon the efficiency of the thermoelectric device 38. In one embodiment, for each one-Watt of waste heat recovered using the energy harvesting system 20, a resulting two-Watts of overall power savings for the data center is realized.

The energy harvesting system 20 is comprised of a thermoelectric device 38, one or more collection units 22, 24 and a controller 70. The energy harvesting system 20 produces usable energy from waste heat and combines the usable energy with utility-input energy 60 to power the data center 100 partially or completely depending on the installation. The thermoelectric device 38 may be a heat pump, heat exchanger, or any solid state device capable of utilizing a temperature gradient for heat transfer and energy recovery.

Hot exhaust air, or waste heat 14, is expelled from servers 50 and other IT/computing equipment as the servers 50 consume power during operation and performance of computational tasks. The waste heat 14 measures about 45 degrees Celsius. The waste heat 14 is contained in the data center 100 by a solid door 12 at the rear of the data center 100. Further, rack spacers are also used to fill empty positions between servers 50 in the rack, preventing the waste heat 14 from being contained in the empty positions. The solid door 12 may be located opposite the vented door 10 in the data center 100.

Room temperature air 15 is circulating through the data center 100 at about 25 degrees Celsius at the same time the waste heat 14 is being generated. The waste heat 14 and room temperature air 15 are directed over heat sinks 23, 27 and further into the thermoelectric device 38 by one or more collection units 22, 24 such as variable speed exhaust fans, outflow fans and fans internal to the servers. The one or more collection devices 22, 24 harness and direct the waste heat 14 and room temperature air 20 into the thermoelectric device 38.

The thermoelectric device 38 receives the waste heat 14 and room temperature air 15 and detects a temperature gradient between the waste heat 14 and room temperature air 15. The greater the temperature gradient between the room temperature air 15 and the waste heat 14, the greater the direct current (DC) electrical energy that is produced at the output of the thermoelectric device 38. The thermoelectric device 38 converts the waste heat 14 and room temperature air 15 into an electrical potential. The electrical potential is interpreted, conditioned and distributed by a controller 70.

The controller 70 is comprised of a central processing unit, memory, communication interfaces, digital and analog inputs and outputs, and a power converter. The controller 70 executes purpose built and/or general purpose software which direct the overall operations of the energy harvesting system 20 and general data center 100 operations.

The communication interfaces of the controller 70 provide serial communication between a pair of redundant controllers and to the data center infrastructure management (DCIM) and other supervisory systems. The controller 70 has interfaces and software that collects measurement data from a set of sensors installed in the data center itself and equipment within the data center. The sensors provide environmental, electrical and physical security data.

The controller 70 has interfaces and software to control the operation of electrical breakers, protection equipment, and fans such as the variable speed exhaust fans referred to above. The controller 70 uses an internal electrical bus to combine electrical power from the power feed 60, with power from the thermoelectric device 38 and the energy storage device 66 to deliver power to the servers 50 using the power distribution functionality. The controller 70 also delivers power to the energy storage device 66.

A control algorithm determines the amount of electrical energy consumed by the servers 50, protective equipment, data center cooling equipment, building management system, and other devices in the data center. The control algorithm further distributes to each heat sink in the data center in such a way as to minimize the electrical energy from the power feed 60.

Further, another control algorithm determines the appropriate fan speed to ensure the internal pressure of the server 50 cabinet is equal to the ambient air pressure in the data center 100, room, or compartment within the data center 100 housing the server 50 cabinet in order to optimize the flow of air through the computer servers 50 and thermoelectric device 38.

The software stored in a computer-readable medium or otherwise in the controller 70 further collects and measures data, computes analytics of the data and records both the raw measurements and the analytics in a database arranged to preserve historical records of the data. The controller 70 software provides communication protocols which allow the transmission of measurement data and analytics to other systems as well as accepting supervisory control commands from other systems such as supervisory control and data acquisition (SCADA) and building management systems (BMS).

The electrical energy recovered by the thermoelectric device 38 at the direction of the controller 70 is then added to an input energy source such as a utility-provided energy input 60. In one embodiment, a portion of the DC power generated by the thermoelectric device 38 is stored in an energy storage module 66. The energy storage module 66 provides at least sixty (60) seconds of backup power to the data center 100 servers 50 and other equipment in the event of loss of primary and secondary power feeds to the data center 100.

As the utility-provided input power is typically alternating current (AC) power and the output of the energy harvesting equipment is DC power, an inverter 64 is required at the output of the thermoelectric device 38. The inverter 64 converts the DC electric potential into AC power, thereby synchronizing the AC power to a power line frequency 60.

In one embodiment, it is necessary to pass the output power of the inverter 64 through a filter 62 before combining the recovered energy (recovered from the conversion of the waste heat to usable energy) with utility-input power. The AC power at the output of the inverter 64 is then fed back into the data center 100 to power the servers 50 and other equipment in the data center 100 such as CRAHs and CRACs.

Alternatively, the data center 100 contains servers 50 and other equipment capable of operating with a DC power input. In that same embodiment, the DC power generated by the thermoelectric device 38 is directed immediately to the servers 50 and other equipment by the controller 70 without requiring an inverter 64. A rectifier may be used to convert the utility-input AC power to DC power, at which point the recovered DC power from the energy harvesting system 20 is combined with the rectified utility-input power 60. The resulting DC power feed having utility-input 60 and waste heat-recovered power is then fed back to the data center 100 servers 50 and other equipment for consumption.

During operation, the thermoelectric device 38 expels exhaust air streams 26, 28 that are further directed into a return plenum 40. The return plenum 40 routes the now-combined exhaust air streams 26, 28 to the CRAH or CRAC, thereby forming a closed cooling loop.

Figure 2:
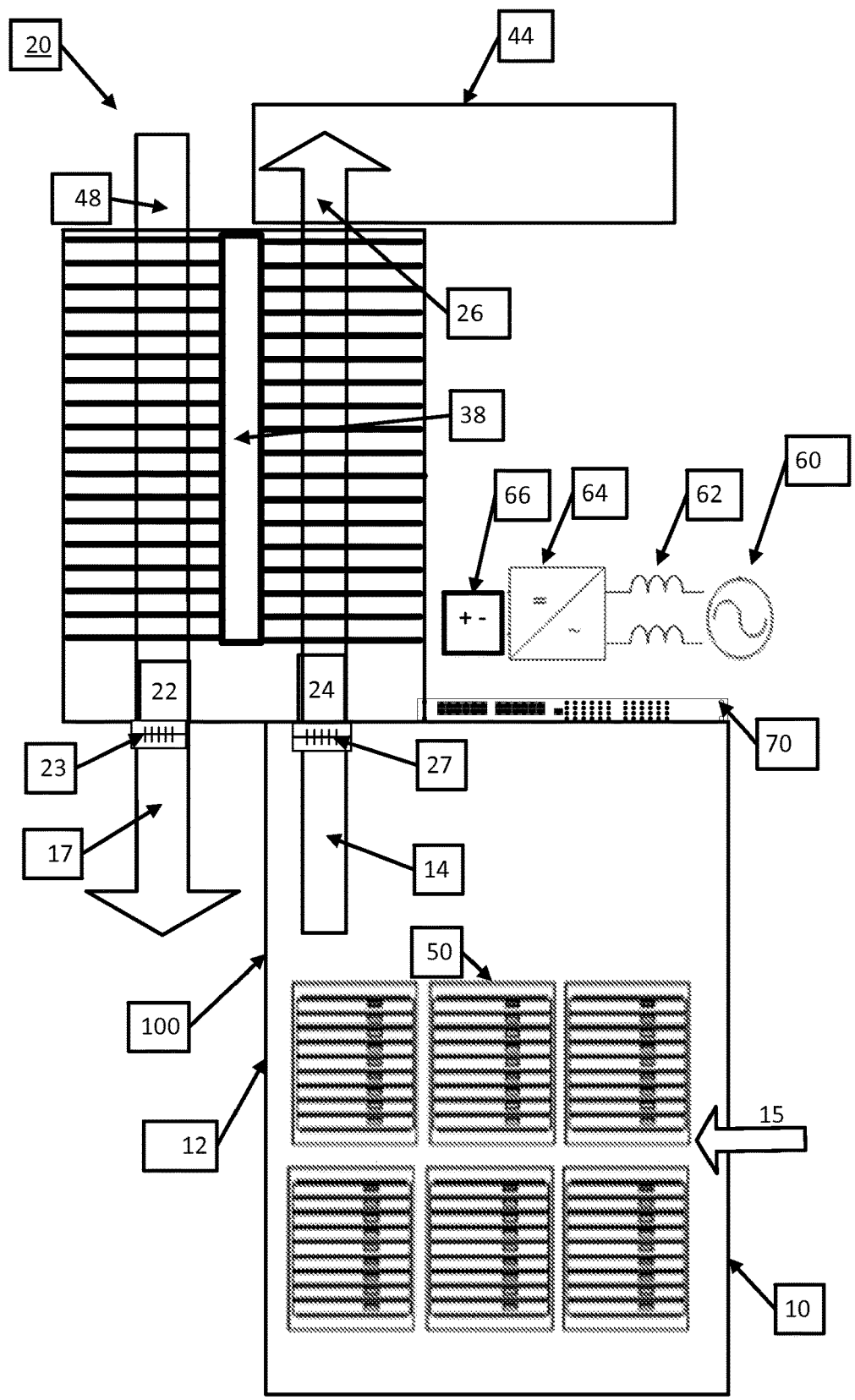
FIG. 2 is a schematic view of a second embodiment of the energy harvesting system in a data center having a chilled water loop.

Referring now to FIG. 2, a second embodiment of the energy harvesting system 20 is depicted. The second embodiment of the energy harvesting system 20 utilizes a chilled water loop 48 to create a greater temperature gradient across the thermoelectric device 38. In one embodiment, the chilled water supply 48 is about 10 degrees Celsius and the waste heat 14 generated at the output of the computer (IT) equipment in the data center 100 is about 45 degrees Celsius. The greater temperature gradient allows to the thermoelectric device 38 at the direction of the controller 70 to generate more power from the conversion of the input streams 48, 14.

Following the conversion of input streams 48, 14 to usable energy, the exhaust air 26 is directed from the thermoelectric device 38 into a return plenum 44. The chilled water supply 48 is returned to a chiller for further cooling.

Figure 3:
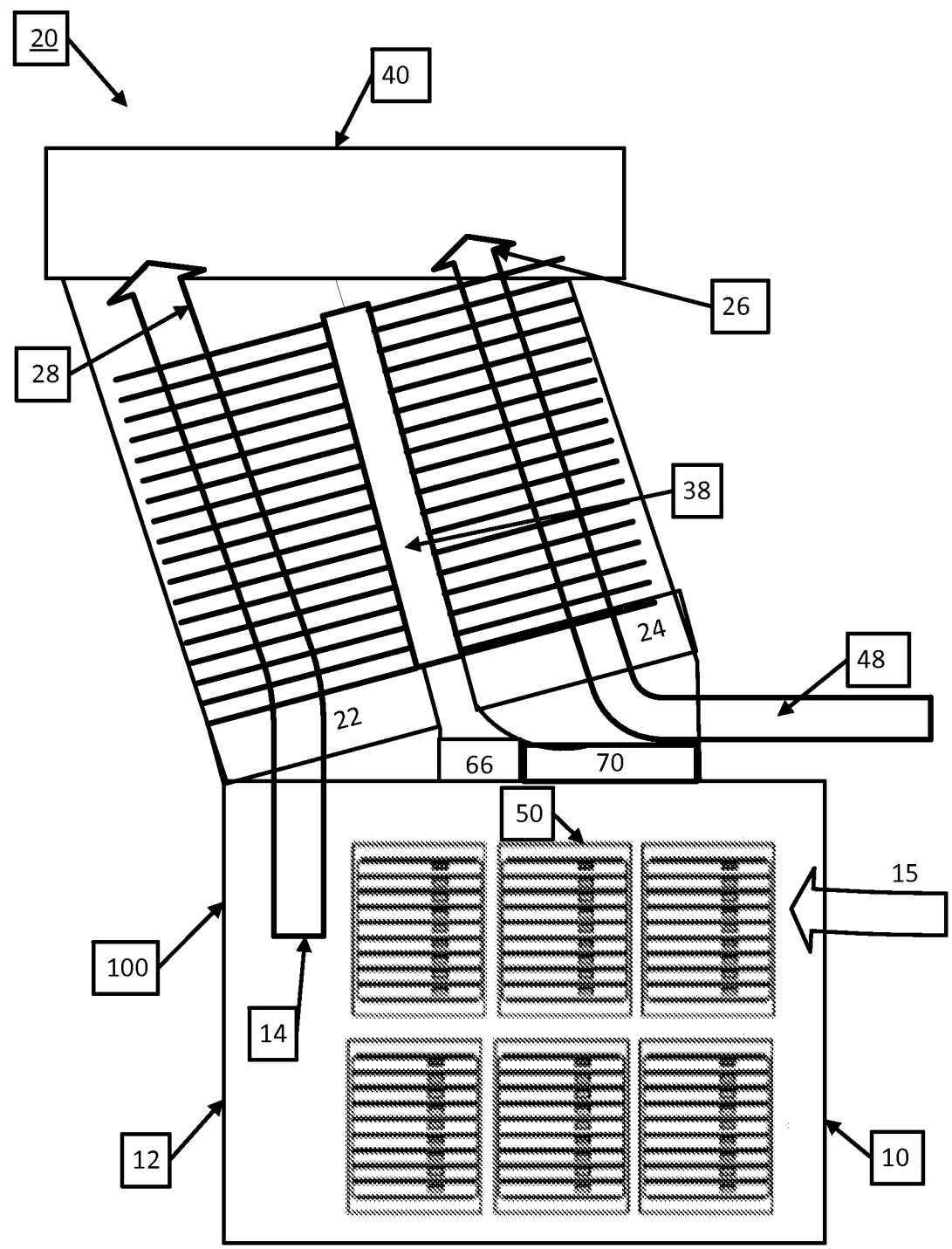
FIG. 3 shows an alternate arrangement of the first embodiment of the energy harvesting system of FIG. 1.

Referring now to FIG. 3, a third embodiment of the energy harvesting system 20 for the data center 100 is shown. The third embodiment uses cool air 27 generated by a CRAH or CRAC located inside the data center 100. Alternatively, the cool air 27 may be generated in a room separated from the data center 100 main operational room by walls or partitions.

Figure 4:
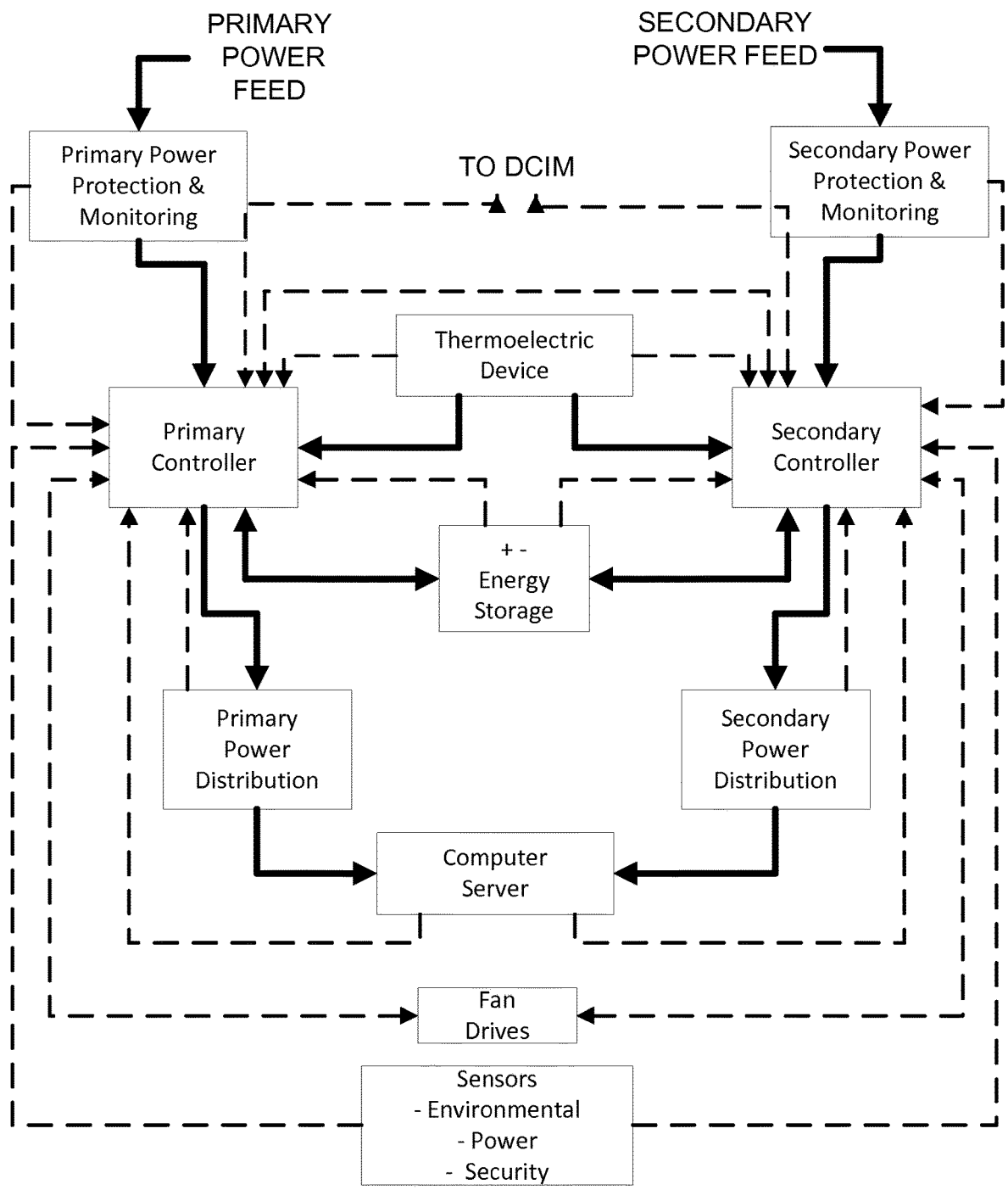
FIG. 4 shows the energy and data flow between the energy harvesting, IT and building management equipment and devices in the data center.

With reference to FIG. 4, data and power flow through the data center 100 and energy harvesting system 20 is shown. The data center 100 has primary and secondary power feeds. The secondary power feed is a redundant energy branch that is powered by a diesel generator, flywheel or other suitable equipment for providing backup power to the data center 100 in the event of interruption to the primary power feed.

The primary power feed enters the data center 100 at the primary power protection and monitoring section. The primary controller directs the distribution of power to the energy storage module and the primary power distribution system. The servers 50 are powered by the primary power distribution system. The energy storage module is available to provide backup power, the distribution of which is directed by the primary and secondary controllers in the event of power interruption in the primary and secondary power feeds.

The data flow in the data center 100 follows a path wherein all devices (servers, fan drivers, thermal, environmental, power and security sensors) transmit data and/or signals to the primary controller 70. The primary controller 70 uses Ethernet communications to enable direct integration into a Data Center Infrastructure Management (DCIM) system and thereby control the power distribution, energy management, server rack monitoring, and building management conditions (such as power, temperature, humidity, airflow, smoke detection, leak detection and data center entry security).

Air flow data collected by the primary controller is used by the DCIM system to create a feed forward closed loop control over the CRAH, CRAC, and other cooling equipment. The air flow data is further used to create an air balance in the data center to prevent hot spots where the computing equipment is operating within safe temperature thresholds.

The primary controller 70 interprets the sensor data and directs the power distribution modules and operation of the fan drives of the one or more collection devices 22, 24 and thermoelectric device 38.

The method for harvesting energy from waste heat in the data center 100 has the following steps: a) directing server exhaust air and another air stream in the data center using one or more collection devices into a thermoelectric device; b) using the thermoelectric device to convert the air streams to usable energy; c) combining the usable energy with utility input power; and d) providing the combined power source to operate the servers 50 and other equipment in the data center 100.

While the present application illustrates various embodiments, and while these embodiments have been described in some detail, it is not the intention of the applicant to restrict or in any way limit the scope of the appended claims to such detail. Additional advantages and modifications will readily appear to those skilled in the art. Therefore, the invention, in its broader aspects, is not limited to the specific details, the representative embodiments, and illustrative examples shown and described. Accordingly, departures may be made from such details without departing from the spirit or scope of the applicant's general inventive concept.

What is claimed is:

1. A system for generating from waste heat in a data center, electricity usable by computing devices in said data center, the system comprising:
   a first collection device configured and positioned to direct waste heat that is generated in a data center into a thermoelectric device;
   a second collection device configured and positioned to direct an other input stream in the data center into the thermoelectric device, the other input stream being a room temperature air that is circulated through the data center as the waste heat is being generated;
   said thermoelectric device configured for receiving (1) the waste heat from the first collection device, and (2) the other input stream from the second collection device, said thermoelectric device adapted to interpret a temperature gradient between the waste heat and the other input stream, and generate from said temperature gradient an electrical potential as an output;
   a return plenum having an inlet side and an outlet side, the inlet side positioned to receive both the waste heat and the other input stream that circulated through the thermoelectric device, the return plenum configured to combine the received waste heat and the other input stream to form a mixed exhaust gas that is outputted from an outlet side of the return plenum for delivery to one or more components of the data center;
   a controller for directing the conversion of said thermoelectric device-generated electrical potential to usable electricity, said usable electricity combinable with utility-input electricity to deliver a primary data center power feed to one or more computing devices in said data center;
   a secondary power feed configured to deliver a secondary data center power feed to one or more computing devices in said data center upon an interruption in the delivery of the primary data center power feed, the secondary power feed being a redundant energy supply; and
   an energy storage module adapted to store a backup power feed, the energy storage module being adapted for selective release of the backup power feed as input to the data center during an interruption to both the primary data center power feed and the secondary data center power feed.

2. The system of claim 1, further including a first heat sink and a second heat sink, the first heat sink and the second heat sink positioned upstream of the thermoelectric device, the first collection device configured and positioned to direct a flow of the waste heat over the first heat sink and into the thermoelectric device, and the second collection device positioned to direct a flow of the waste heat over the second heat sink and into the thermoelectric device.

3. The system of claim 1, wherein said controller receives data from sensors installed in the data center and uses said data to adjust environmental parameters in the data center.

4. The system of claim 1, wherein the controller directs the selective release of the backup power feed from the energy storage module.

5. The system of claim 1, wherein a solid door and a vented door are disposed in opposing walls of the data center.

6. The system of claim 1, wherein the first collection device includes an outflow fan.

7. The system of claim 1, wherein the first collection device includes a fan internal to the one or more computing devices.

8. The system of claim 1, wherein the first collection device and the second collection device direct air into the return plenum.

9. The system of claim 1, further including a database that preserves a plurality of historical records, the plurality of historical records comprising a raw data that is collected from the system and an analytics generated by the controller using at least the raw data.

10. The system of claim 1, wherein the system further comprises an inverter and a filter, said usable electricity passing through the inverter and the filter prior to being combinable with utility-input electricity.

11. The system of claim 1, wherein the system further comprises a rectifier, the rectifier being positioned within the system to convert the utility-input electricity prior to the utility-input electricity being combined with the usable electricity.

12. The system of claim 1, wherein said controller determines an amount of electrical energy consumed by one or more computing devices in said data center.

13. The system of claim 1, wherein the one or more components of the data center comprises at least one of a computer room air handler (CRAH) and a computer room air conditioner (CRAC), and wherein the outlet side of the return plenum routes the mixed exhaust gas to at least one of the CRAH and the CRAC.

* * * * *